(12) United States Patent
Kovacich et al.

(10) Patent No.: US 8,994,544 B2
(45) Date of Patent: *Mar. 31, 2015

(54) SYSTEM INCLUDING AN INDICATOR RESPONSIVE TO AN ELECTRET FOR A POWER BUS

(71) Applicant: Eaton Corporation, Cleveland, OH (US)

(72) Inventors: John A. Kovacich, Waukesha, WI (US); John Trublowski, Troy, MI (US)

(73) Assignee: Eaton Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/307,763

(22) Filed: Jun. 18, 2014

(65) Prior Publication Data
US 2014/0300482 A1    Oct. 9, 2014

Related U.S. Application Data

(63) Continuation of application No. 13/241,770, filed on Sep. 23, 2011, now Pat. No. 8,791,831.

(51) Int. Cl.
*G08B 21/00* (2006.01)
*G01R 19/155* (2006.01)

(52) U.S. Cl.
CPC .................................. *G01R 19/155* (2013.01)
USPC .......................................... 340/660; 340/500

(58) Field of Classification Search
USPC ....................................................... 340/660
See application file for complete search history.

(56) References Cited

U.S. PATENT DOCUMENTS

| | | | |
|---|---|---|---|
| 3,039,013 A | 6/1962 | Wilmotte | |
| 3,627,408 A | 12/1971 | Fergason | |
| 3,810,013 A | 5/1974 | Müller | |
| 4,587,509 A | 5/1986 | Pitt et al. | |
| 4,595,876 A | 6/1986 | Kuhara et al. | |
| 4,616,207 A | 10/1986 | Knapp, Jr. et al. | |
| 4,951,169 A * | 8/1990 | Morse | 361/42 |

(Continued)

FOREIGN PATENT DOCUMENTS

| | | |
|---|---|---|
| CN | 2159024 Y | 3/1994 |
| CN | 1862264 A | 11/2006 |

(Continued)

OTHER PUBLICATIONS

Wikipedia Foundation, Inc., "Electret—Wikipedia, the free encyclopedia", http://en.wikipedia.org/wiki/Electret, 2011, 3 pp.

*Primary Examiner* — Kerri McNally
(74) *Attorney, Agent, or Firm* — Eckert Seamans Cherin & Mellott, LLC; Philip E. Levy

(57) ABSTRACT

An indicator system for an alternating current power bus includes an electret operatively associated with the alternating current power bus. The electret includes an output having an alternating current voltage when the alternating current power bus is energized. A rectifier includes an input electrically interconnected with the output of the electret and an output having a direct current voltage responsive to the alternating current voltage of the output of the electret. An indicator includes an input electrically interconnected with the output of the rectifier and an indication output responsive to the direct current voltage of the output of the rectifier.

11 Claims, 1 Drawing Sheet

(56) References Cited

U.S. PATENT DOCUMENTS

| | | |
|---|---|---|
| 5,255,428 A | 10/1993 | Gottsche et al. |
| 5,408,187 A * | 4/1995 | Mackie ........................ 324/555 |
| 5,635,831 A | 6/1997 | Englund |
| 5,751,143 A | 5/1998 | Fava |
| 5,939,711 A | 8/1999 | Crawford et al. |
| 6,130,599 A | 10/2000 | Juds et al. |
| 6,140,810 A | 10/2000 | Bohnert et al. |
| 6,252,388 B1 | 6/2001 | Jaeger et al. |
| 6,271,656 B1 | 8/2001 | Juds et al. |
| 6,285,182 B1 | 9/2001 | Blake et al. |
| 6,307,666 B1 | 10/2001 | Davidson et al. |
| 6,380,725 B1 | 4/2002 | Chavez et al. |
| 6,621,258 B2 | 9/2003 | Davidson et al. |
| 6,642,704 B2 | 11/2003 | Hastings et al. |
| 6,731,105 B1 | 5/2004 | Hoyle et al. |
| 6,876,188 B2 | 4/2005 | Bohnert et al. |
| 7,084,616 B1 | 8/2006 | Jenau et al. |
| 7,145,322 B2 | 12/2006 | Solveson et al. |
| 7,911,196 B2 | 3/2011 | Bohnert |
| 2004/0239306 A1 | 12/2004 | Barrault et al. |
| 2005/0123687 A1* | 6/2005 | Jacobs et al. .................. 427/457 |
| 2006/0091435 A1* | 5/2006 | Liljedahl et al. .............. 257/295 |
| 2007/0007968 A1 | 1/2007 | Mauney, Jr. et al. |
| 2008/0309304 A1 | 12/2008 | Kimura et al. |
| 2009/0290165 A1 | 11/2009 | Bohnert et al. |
| 2010/0009166 A1* | 1/2010 | Bendjaballah et al. ....... 428/323 |
| 2011/0050207 A1 | 3/2011 | Bohnert et al. |

FOREIGN PATENT DOCUMENTS

| | | |
|---|---|---|
| CN | 101251560 A | 8/2008 |
| CN | 101382568 A | 3/2009 |
| CN | 201281725 Y | 7/2009 |
| CN | 201281726 Y | 7/2009 |
| EP | 109914 A1 | 5/1984 |
| EP | 0826970 A2 | 3/1998 |
| FR | 2942543 A1 | 8/2010 |
| JP | 62254059 A | 11/1987 |
| JP | 6050998 A | 2/1994 |
| JP | 7110346 A | 4/1995 |
| JP | 8136588 A | 5/1996 |
| JP | 8285898 A | 11/1996 |
| JP | 9251036 A | 9/1997 |
| JP | 9292414 A | 11/1997 |
| JP | 10260212 A | 9/1998 |
| JP | 3235064 B2 | 10/2001 |
| JP | 2002350471 A | 12/2002 |
| JP | 2009043593 A | 2/2009 |
| JP | 04474536 B2 | 3/2010 |
| KR | 1020000050491 A | 8/2000 |
| SE | 8200445-8 | 2/1983 |
| WO | 9312435 A1 | 6/1993 |
| WO | 2011000074 A1 | 1/2011 |

* cited by examiner

SYSTEM INCLUDING AN INDICATOR RESPONSIVE TO AN ELECTRET FOR A POWER BUS

CROSS-REFERENCE TO RELATED APPLICATIONS

This application is a continuation of, and claims priority under 35 U.S.C. §120 from, U.S. patent application Ser. No. 13/241,770, filed Sep. 23, 2011, entitled "SYSTEM INCLUDING AN INDICATOR RESPONSIVE TO AN ELECTRET FOR A POWER BUS", the contents of which are incorporated herein by reference.

This application is related to commonly assigned, copending U.S. patent application Ser. No. 13/241,862, filed Sep. 23, 2011, entitled "POWER SYSTEM INCLUDING AN ELECTRET FOR A POWER BUS"

BACKGROUND

1. Field

The disclosed concept pertains generally to power bus apparatus and, more particularly, to power systems including an alternating current power bus. The disclosed concept also pertains to indicator systems for an alternating current power bus.

2. Background Information

Inside of electrical control centers, as well as other electrical environments, there are bus bar wiring conductors and lugged cable connection conductors, as well as conductor taps for three-phase power. This is true regardless whether the corresponding electrical product is for low-voltage or for medium-voltage.

Maintenance personnel can be harmed when accidentally touching energized surfaces of power bus bars.

Electrical sensors of various types are used to detect the current flowing through a conductor. Such sensors include, for example, a single Hall effect sensor that produces an output voltage indicative of the current magnitude as well as more conventional current sensors such as a shunt resistor or a current transformer.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509; and 4,616,207.

It is also known to measure the current in a conductor with one or two appropriately placed Hall sensors that measure flux density near the conductor and to convert the same to a signal proportional to current. See, for example, U.S. Pat. Nos. 6,130,599; 6,271,656; 6,642,704; and 6,731,105.

U.S. Pat. No. 7,145,322 discloses a power bus current sensor, which is powered by a self-powered inductive coupling circuit. A sensor senses current of the power bus. A power supply employs voltage produced by magnetically coupling the power bus to one or more coils, in order to power the sensor and other circuitry from flux arising from current flowing in the power bus.

U.S. Patent Application Pub. No. 2007/0007968 discloses a system for monitoring an electrical power system including one or more transducer units, each of which has a current measuring device and a voltage measuring device coupled to a respective one of the phase conductors of the power system, and a transducer wireless communications device. The transducer unit includes a battery for providing power to the components thereof. The battery is connected to a trickle charger, which, in turn, is electrically coupled to a phase conductor. The trickle charger is a known parasitic power charger that draws power from the phase conductor and uses it to charge the battery.

A known prior proposal for monitoring a bus bar wiring conductor employs a current transformer to harvest energy or an associated signal, through coupling to the magnetic field caused by current flowing through the conductor. However, if a load is not connected to the conductor, and, thus, no current is flowing, then a current transformer (or magnetic coupling) will not function.

There is room for improvement in indicator systems for a power bus.

There is further room for improvement in power systems including a power bus.

SUMMARY

These needs and others are met by embodiments of the disclosed concept, which provide a system for an alternating current power bus comprising an electret operatively associated with the alternating current power bus and an indicator directly or indirectly responsive to the output of the electret.

In accordance with one aspect of the disclosed concept, an indicator system for an alternating current power bus comprises: an electret operatively associated with the alternating current power bus, the electret comprising an output having an alternating current voltage when the alternating current power bus is energized; a rectifier comprising an input electrically interconnected with the output of the electret and an output having a direct current voltage responsive to the alternating current voltage of the output of the electret; and an indicator comprising an input electrically interconnected with the output of the rectifier and an indication output responsive to the direct current voltage of the output of the rectifier.

The indication output of the indicator may be active responsive to the direct current voltage of the output of the rectifier when the alternating current power bus is energized.

The alternating current power bus may have an alternating current flowing therethrough.

Zero current may flow through the alternating current power bus.

As another aspect of the disclosed concept, an indicator system for an alternating current power bus comprises: an electret operatively associated with the alternating current power bus, the electret comprising an output having an alternating current voltage when the alternating current power bus is energized; and an indicator comprising an input electrically interconnected with the output of the electret and an indication output responsive to the alternating current voltage of the output of the electret.

As another aspect of the disclosed concept, a power system comprises: an alternating current power bus; an electret operatively associated with the alternating current power bus, the electret comprising an output having an alternating current voltage when the alternating current power bus is energized; and an indicator circuit comprising an input electrically interconnected with the output of the electret and an indication output responsive to the alternating current voltage of the output of the electret.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

An "electret" is a dielectric material that has a permanent or quasi-permanent electric charge and/or dipole polarization, and also has piezoelectric characteristics. The electret dielectric material is typically metalized for electrical connectivity and is fabricated in such a fashion that an electric field exists within the dielectric material. The electret is the electrostatic equivalent of a permanent magnet. Electrets do not typically have the capability to generate much current but can be used to provide a reference potential difference.

As employed herein the term "switchgear device" shall expressly include, but not be limited by, a circuit interrupter, such as a circuit breaker (e.g., without limitation, low-voltage or medium-voltage or high-voltage); a motor controller/starter; a busway; and/or any suitable device which carries or transfers current from one place to another.

As employed herein the term "power bus" shall mean a power conductor; a power bus bar; a power line; a power phase conductor; a power cable; and/or a power bus structure for a power source, a circuit interrupter or other switchgear device, or a load powered from the power bus.

Figure 1:
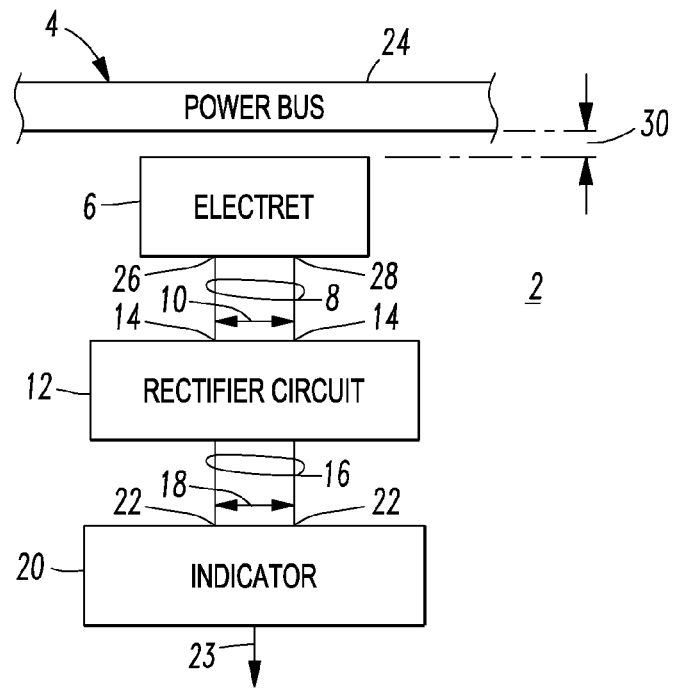
FIG. 1 is a block diagram of an indicator system including an electret, a rectifier and a visual indicator in accordance with embodiments of the disclosed concept.

FIG. 1 shows an indicator system 2 for an alternating current (AC) power bus 4. The indicator system 2 includes an electret 6 operatively associated with the AC power bus 4. The electret 6 includes an output 8 having an AC voltage 10 when the AC power bus 4 is energized. The indicator system 2 also includes a rectifier, such as a suitable rectifier circuit 12, having an input 14 electrically interconnected with the output 8 of the electret 6 and an output 16 having a direct current (DC) voltage 18 (e.g., without limitation, pulsed DC; full wave rectified DC; full wave rectified and filtered DC) responsive to the AC voltage 10 of the output 8 of the electret 6, and an indicator, such as the example visual indicator 20, including an input 22 electrically interconnected with the output 16 of the rectifier circuit 12 and an indication output 23 responsive to the DC voltage 18 of the output 16 of the rectifier circuit 12.

As shown in FIG. 1, the power bus 4 (e.g., without limitation, a power bus bar or power conductor) is energized with an AC voltage 24 (with respect to a ground or neutral potential (not shown)). The electret 6 has two output terminals 26,28 for connection to the rectifier circuit 12.

In this embodiment, the electret 6, having a permanent, inherent electrostatic field (e.g., without limitation, when coupled to an adjacent energized AC power bus 4) provides a localized circuit ground potential from which subsequent circuitry can be referenced. When an AC field is present, the electret 6, which has a construction containing a dielectric sandwiched by metal contacts, will behave like a capacitor and will charge in the presence of the AC field to provide stored energy to the output 8. For example, the electret 6 has a combination of characteristics, such as permanent charge or dipole characteristics, and can have internal electric field storage similar to a capacitor. But since it also has piezoelectric characteristics, it can act in concert with a driving AC energizing voltage to be stressed through the internal electric field (capacitive) effect and then "rebound" through the piezoelectric effect to then generate the corresponding output AC voltage 10. The output voltage and current is determined by the strength of the AC field in the proximity of the electret 6, the duration that the electret 6 is present within the AC field, and the distance between the electret 6 and the field generating power bus 4. This output voltage is converted from AC to DC through the use of the rectifier circuit 12. The output AC voltage 10 is converted to the output DC voltage 18 by the rectifier circuit 12. The output DC voltage 18 of the rectifier circuit 12 then can act on the visual indicator 20 to be powered using current or charge stored internally through the internal electret electric field in conjunction with the internal piezoelectric character by the electret 6 in the presence of the AC field. Use of the rectifier circuit 12 to convert the output AC voltage 10 of the electret 6 to the output DC voltage 18 of the rectifier circuit 12 is employed when the visual indicator 20 needs to be powered by DC voltage.

The electret 6, the rectifier circuit 12 and the visual indicator 20 are electrically "floating" with respect to the power bus 4. None of this is directly electrically connected to ground potential or to the bus bar potential, such that the interaction is through the power bus AC electric field. The electret 6 is adjacent to or suitably proximate the power bus 4. The electret 6 is not actually electrically connected to the power bus 4, although it may be suitably mechanically attached or coupled thereto.

The electret 6 acts as a piezoelectric which also has a permanent charge/dipole. The electret 6 interacts with the generated AC electric field of the power bus 4. The electret output 8 provides an electret-generated AC voltage 10.

Example 1

The electret 6 may be an electret device. If a gap 30 is employed between the power bus 4 and the electret 6, then the gap distance is not critically important. However, the closer the electret 6 is to the bus bar 4, the more electric field can be harvested in order to provide more power output. The overall electret device could be physically attached to the power bus 4 (e.g., without limitation, employing adhesive, a bolt or a clamp), in order to position it as close to the power bus 4 as possible in order to harvest relatively more electric field. The electret 6 converts the AC electric field to the output AC voltage 10 in a robust yet passive manner.

Example 2

The electret 6 may be made of an electret material solution packaged within, for example and without limitation, a molded housing (not shown).

Example 3

The electret 6 may be made from a material selected from the group consisting of an organic polymer electret material, and an inorganic electret material, although a wide range of electret materials can be employed (e.g., without limitation, other organic materials; other inorganic materials).

Example 4

The electret 6 is coupled to the AC power bus 4.

Example 5

The rectifier circuit 12 is selected from the group consisting of a diode, a full wave bridge, and an integrated device, although any suitable rectifier circuit 12 can be employed, such as another equivalent circuit or discrete hardware. The rectifier circuit 12 converts the AC output voltage 10 from the electret 6 into a DC output voltage 18 for the DC visual indicator 20.

Example 6

The visual indicator 20 may be "electronic paper" that provides, for example, a non-lighted, suitably high-contrast visual indicator, such as for example and without limitation, "printed electronics" or "electrochromatic inks" marketed by NTERA, Inc. of Radnor, Pa., or "electronic ink" marketed by E Ink Corporation of Cambridge, Massachusetts. Electronic paper types of technology are unique in that they do not draw a significant amount of current to change contrast, only enough to turn on and off. The electronic ink technology requires a voltage input to turn on and a subsequent voltage input to turn off. Once the display turns on, it will stay on until turned off, and a voltage or current is not needed to sustain the display. The printed electronics or electrochromatic inks technology behaves like a leaky capacitor and requires a voltage input to turn on, but it will decay once the voltage is removed. This works well for the disclosed concept since the display is desired to be on while the field is present.

Figure 3:
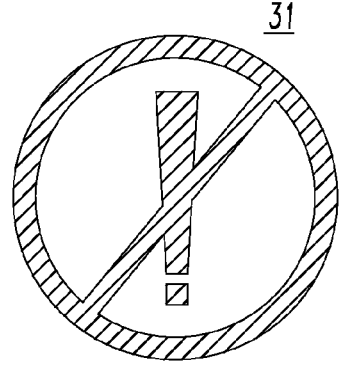
FIG. 3 is a representation of a graphic employed by the visual indicator of FIG. 1.

The visual indicator 20 may include a display of a graphic 31 (FIG. 3) that switches on (or off) in response to the presence (or absence) of the DC output voltage 18, which ultimately responds to the presence (or absence) of an AC electric field of the AC power bus 4. A non-limiting example of the graphic 31 when switched on by the DC output voltage 18 is shown in FIG. 3.

Figure 2:
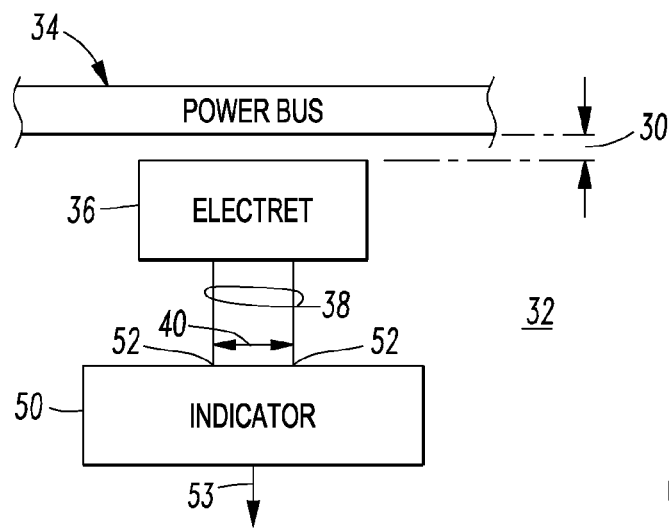
FIG. 2 is a block diagram of an indicator system including an electret and a visual indicator in accordance with another embodiment of the disclosed concept.

Although an example visual indicator 20 is disclosed, the disclosed concept is applicable to a wide range of visual, audible and other indicators driven by the rectifier circuit 12 or by the electrets 6,36 of FIGS. 1 and 2. For example and without limitation, the indicator may be a wireless device structured to report an indication that the AC power bus 4 is energized to a remote location.

Example 7

The visual indicator 20 is powered responsive to the DC voltage 18 of the output 16 of the rectifier circuit 12 when the AC power bus 4 is energized.

Example 8

Further to Example 7, the AC power bus 4 has an alternating current flowing therethrough.

Example 9

Further to Example 7, zero current flows through the AC power bus 4.

Example 10

The visual indicator 20 may have an equivalent circuit characteristic similar to that of a capacitor. In combination with the rectifier circuit 12, the equivalent circuit characteristic, such as the capacitor, can be charged through the use of the rectified DC voltage 18 for use in powering the visual indicator 20.

Example 11

Alternatives for the visual indicator 20 can include other suitable equivalent circuit characteristics. A possible constraint on the visual indicator 20 is that it needs relatively low power or ultralow power, since the ability for the electret 6 to provide substantial current may be limited. However, many such visual indicators 20 are already designed to consume relatively low power or ultralow power.

FIG. 2 shows an indicator system 32 for an AC power bus 34 including an electret 36 operatively associated with the AC power bus 34. The electret 36 includes an output 38 having an AC voltage 40 when the AC power bus 34 is energized, and an indicator, such as an example visual indicator 50, comprising an input 52 electrically interconnected with the output 38 of the electret 36 and an indication output 53 responsive to the AC voltage 40 of the output 38 of the electret 36. The electret 36 and the power bus 34 may be the same as or substantially similar to the respective electret 6 and the power bus 4 of FIG. 1.

In FIG. 2, the visual indicator 50 needs to be powered by an AC voltage similar to what comes directly out of the electret 36 when it is actuated by the AC power bus electric field. In this case, no rectifier circuit is employed.

Example 12

The indicator systems 2,32 of FIGS. 1 and 2 provide a safety function for, for example and without limitation, electrical control enclosures (e.g., without limitation, motor control centers (MCCs)) by indicating (e.g., without limitation, to a maintenance worker, electrician or technician) (e.g., without limitation, through a suitably high-contrast indicator) that a power bus 4,34 has been energized (e.g., by an applied AC voltage, even though electrical current is not necessarily flowing or regardless whether a load is electrically connected). The disclosed concept provides an indicator to alert people about an energized power bus and therefore avoid accidental or unaware-based contact that could otherwise cause severe injury or death.

Example 13

The indicator systems 2,32 of FIGS. 1 and 2 make use of the AC electric field that is generated in the space around a power bus 4,34 that is energized. These employ the generated electric field to "turn-on" an electret 6,36 that is susceptible to the electric field. The electret 6,36 is held in a structure that allows for the electric field of the energized power bus 4,34 to interact with the self-charged, self-field of the electret in a manner that actuates the electret. For example and without limitation, in combination with a suitable visual indicator, this allows for a non-lighted, high-contrast visual indication of "turn-on" status.

Example 14

The indicator systems 2,32 of FIGS. 1 and 2 harvest energy from an AC power bus electric field through use of an electret

6,36. The charge of the electret is acted on by the AC electric field to stress the electret matrix, which in turn responds through its piezoelectric characteristics to output a corresponding AC voltage 10,40, which actuates an indicator to provide an indication of the energized AC power bus.

Example 15

The indicator systems 2,32 of FIGS. 1 and 2 generate useable energy from an energized power bus 4,34 (e.g., by an applied voltage even though electrical current is not necessarily flowing or regardless whether a load is electrically connected) and employ the same to provide an indication of the energized AC power bus.

Example 16

The indicator systems 2,32 of FIGS. 1 and 2 interact with an energized power bus 4,34 through an electric field as opposed to a magnetic field that is generated if current is flowing through the power bus. Hence, this solves the problem of monitoring an energized power bus even if current is not flowing (e.g., without limitation, a downstream circuit breaker is open; the downstream load is disconnected). This advantageously provides a very beneficial result since an energized power bus could have a voltage (and an associated electric field) present without having current flowing and still be a danger to a person who accidentally touched or approached the power bus.

Example 17

For the indicator system 32 of FIG. 2, the input 52 of the visual indicator 50 is powered directly from the AC voltage 40 of the output 38 of the electret 36. For the indicator system 2 of FIG. 1, the input 22 of the visual indicator 20 is powered indirectly through the rectifier circuit 12 from the AC current voltage 10 of the output 8 of the electret 6.

Example 18

The electrets 6,36 can be stand-alone devices in electrical communication with the rectifier circuit 12 and/or the visual indicators 20,50 (and any associated electronics (not shown)). Alternatively, the electrets 6,36 can be part of a molded or a conventional housing (not shown) which contains some or all of the rectifier circuit 12 and/or the visual indicators 20,50 (and any associated electronics (not shown)). The visual indicator 20 is actuated by the DC output voltage 18 of the rectifier circuit 12. Alternatively, the rectifier circuit 12 is not required and a suitable indicator, such as the example visual indicator 50, that is actuated by the AC output voltage 40 of the electret 36 can be employed.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof

What is claimed is:

1. An indicator system for an alternating current power bus, said indicator system comprising:
   an electret operatively associated with said alternating current power bus, said electret comprising an output having an alternating current voltage when said alternating current power bus is energized with a power bus alternating current voltage; and
   an indicator comprising: (i) an input wired to the output of said electret such that said input is physically electrically interconnected with the output of said electret, and (ii) an indication output responsive to the alternating current voltage of the output of said electret, wherein the indicator is driven directly by said alternating current voltage of the output of said electret and driven indirectly but not directly by said power bus alternating current voltage.

2. The indicator system of claim 1 wherein said electret is an electret device.

3. The indicator system of claim 1 wherein said electret is made of an electret material solution.

4. The indicator system of claim 1 wherein said electret is made of an organic polymer electret material.

5. The indicator system of claim 1 wherein said electret is made of an inorganic electret material.

6. The indicator system of claim 1 wherein said electret is coupled to said alternating current power bus.

7. The indicator system of claim 1 wherein said indicator is a visual indicator.

8. The indicator system of claim 1 wherein the indication output of said indicator is active responsive to the alternating current voltage of the output of said electret when said alternating current power bus is energized.

9. The indicator system of claim 8 wherein said alternating current power bus has an alternating current flowing therethrough.

10. The indicator system of claim 8 wherein zero current flows through said alternating current power bus.

11. A power system comprising:
    an alternating current power bus;
    an electret operatively associated with said alternating current power bus, said electret comprising an output having an alternating current voltage when said alternating current power bus is energized with a power bus alternating current voltage; and
    an indicator circuit comprising: (i) an input wired to the output of said electret such that said input is physically electrically interconnected with the output of said electret, and (ii) an indication output responsive to the alternating current voltage of the output of said electret, wherein the indicator is driven directly by said alternating current voltage of the output of said electret and driven indirectly but not directly by said power bus alternating current voltage.

* * * * *